(12) United States Patent
Cheng et al.

(10) Patent No.: US 10,170,322 B1
(45) Date of Patent: Jan. 1, 2019

(54) ATOMIC LAYER DEPOSITION BASED PROCESS FOR CONTACT BARRIER LAYER

(71) Applicant: Taiwan Semiconductor Manufacturing Co., Ltd., Hsinchu (TW)

(72) Inventors: Chung-Liang Cheng, Changhua County (TW); Yu-Lin Liu, Taipei (TW); Ming-Hsien Lin, Taichung (TW); Tzo-Hung Luo, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/815,059

(22) Filed: Nov. 16, 2017

(51) Int. Cl.
*H01L 21/285* (2006.01)
*H01L 23/532* (2006.01)
*H01L 21/768* (2006.01)

(52) U.S. Cl.
CPC .. *H01L 21/28556* (2013.01); *H01L 21/28568* (2013.01); *H01L 21/76847* (2013.01); *H01L 21/76877* (2013.01); *H01L 23/53209* (2013.01); *H01L 21/76804* (2013.01)

(58) Field of Classification Search
CPC ......... H01L 21/28556; H01L 21/28568; H01L 23/53209; H01L 21/76847; H01L 21/76877; H01L 21/76804
See application file for complete search history.

(56) References Cited

U.S. PATENT DOCUMENTS

| 6,787,453 | B2 | 9/2004 | Abell |
| 7,498,242 | B2 | 3/2009 | Kumar et al. |
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |

(Continued)

OTHER PUBLICATIONS

Hyungjun Kim, IBM Research Report, "Atomic Layer Deposition of Metal and Nitride Thin Films: Current Research Efforts and Applications for Semiconductor Device Processing," RC22737 (W0303-012) Mar. 5, 2003, 121 pages, IBM Thomas J. Watson Research Center, Yorktown Heights, NY 10598.

*Primary Examiner* — Karen Kusumakar
(74) *Attorney, Agent, or Firm* — Haynes and Boone, LLP

(57) ABSTRACT

Interconnect structures and corresponding techniques for forming the interconnect structures are disclosed herein. An exemplary method includes forming a contact opening in a dielectric layer. The contact opening has sidewalls defined by the dielectric layer and a bottom defined by a conductive feature. An ALD-like nitrogen-containing plasma pre-treatment process is performed on the sidewalls (and, in some implementations, the bottom) of the contact opening. An ALD process is performed to form a titanium-and-nitrogen containing barrier layer over the sidewalls and the bottom of the contact opening. A cobalt-containing bulk layer is then formed over the titanium-and-nitrogen-containing barrier layer. A cycle of the ALD-like nitrogen-containing plasma pre-treatment process can include a nitrogen-containing plasma pulse phase and a purge phase. A cycle of the ALD process can include a titanium-containing pulse phase, a first purge phase, a nitrogen-containing plasma pulse phase, and a second purge phase.

20 Claims, 10 Drawing Sheets

(56) References Cited

U.S. PATENT DOCUMENTS

| | | |
|---|---|---|
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,640,427 B2 * | 5/2017 | Deng ................ H01L 21/76826 |
| 2006/0110943 A1 | 5/2006 | Swerts et al. |
| 2018/0061705 A1 * | 3/2018 | Briggs .............. H01L 23/53238 |

* cited by examiner

ATOMIC LAYER DEPOSITION BASED PROCESS FOR CONTACT BARRIER LAYER

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as IC technologies expand into sub-20 nm technology nodes, cobalt-based interconnect structures have been implemented to improve performance. Cobalt-based interconnect structures exhibit better sheet resistance and/or electromigration (EM) performance compared to traditional copper-based interconnect structures. Although existing cobalt-based interconnect structures have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
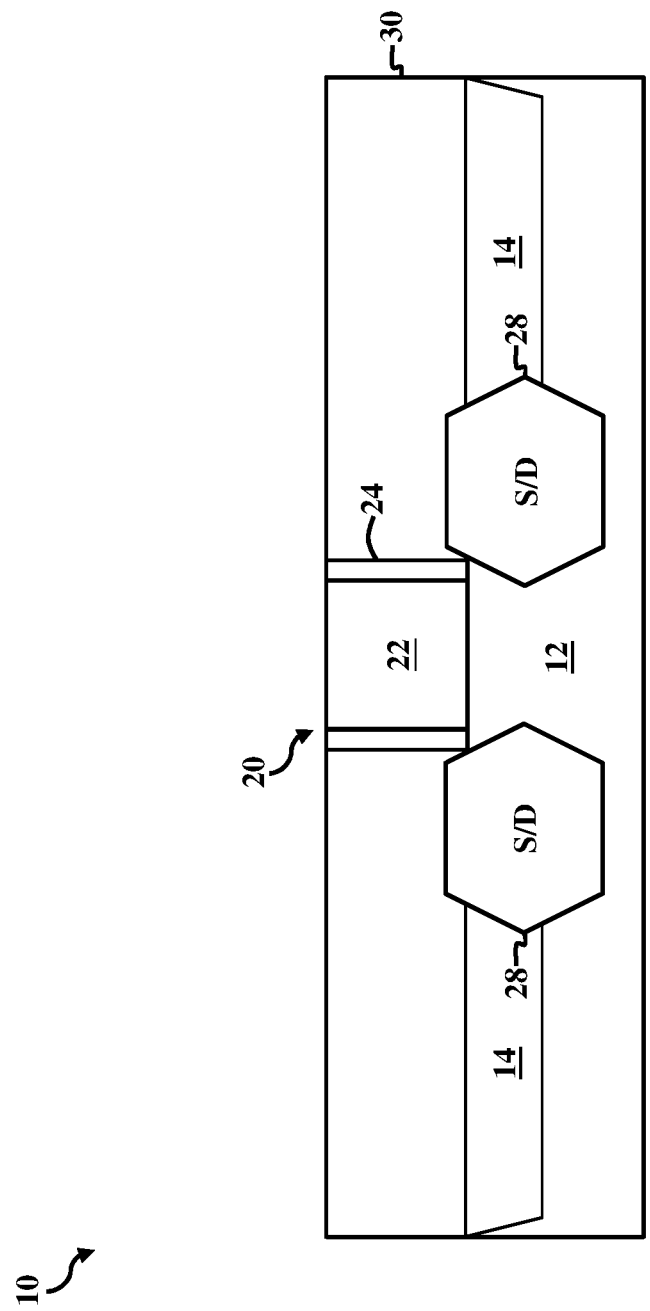
FIGS. 1A-1H are fragmentary diagrammatic views of an integrated circuit device, in portion or entirety, at various fabrication stages associated with forming an interconnect structure according to various aspects of the present disclosure.

The present disclosure relates generally to integrated circuit devices, and more particularly, to interconnect structures for integrated circuit devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

A multilayer interconnect (MLI) feature electrically couples various devices (for example, transistors, resistors, capacitors, and/or inductors) and/or components (for example, gate structures and/or source/drain features) of an integrated circuit (IC) device, such that the various devices and/or components can operate as specified by design requirements. The MLI feature includes a combination of dielectric layers and conductive layers configured to form various interconnect structures. The conductive layers are configured to form vertical interconnect features, such as device-level contacts and/or via contacts, and/or horizontal interconnect features, such as conductive lines. Vertical interconnect features typically connect horizontal interconnect features in different layers (or different planes) of the MLI feature. During operation of the IC device, the interconnect structures route signals between the devices and/or the components of the IC device and/or distribute signals (for example, clock signals, voltage signals, and/or ground signals) to the devices and/or the components.

Interconnect structures typically include copper. However, as IC technologies progress towards smaller technology nodes and interconnect structures become more compact, copper-based interconnect structures have been observed to degrade performance, develop voids (arising, for example, from higher aspect ratio interconnect openings), and increase resistance-capacitance (RC) delay in ICs. To compensate for these issues, IC manufacturers are exploring new materials for the interconnect structures, such as aluminum, tungsten, cobalt, and/or ruthenium. Cobalt, in particular, exhibits better sheet resistance and/or electromigration (EM) performance than traditional interconnect materials, such as copper, and is easily integrated into conventional IC fabrication processes. Contacts of MLI features thus often include a cobalt bulk layer, where the cobalt bulk layer is disposed over a titanium-and-nitrogen containing barrier layer (often disposed along sidewalls and/or bottoms of a contact opening defined, for example, by an interlevel dielectric (ILD) layer and/or an underlying conductive feature).

Traditional contact formation methods implement a chemical vapor deposition (CVD) process to form the titanium-and-nitrogen-containing barrier layer. However, it has been observed that a CVD-formed titanium-and-nitrogen containing barrier layer poorly conforms to the surfaces of the MLI feature defining the contact opening (such as sidewall surfaces defined by an ILD layer). The CVD-formed titanium-and-nitrogen containing barrier layer is often not continuous along the surfaces of the MLI feature defining the contact opening. It has further been observed that the cobalt bulk layer poorly adheres to the non-conformal and/or non-continuous CVD-formed titanium-and-nitrogen containing barrier layer, inducing one or more voids in the cobalt bulk layer. Such voids significantly degrade the EM performance of the cobalt bulk layer, degrading overall performance of the IC device. The present disclosure thus proposes a two-step atomic layer deposition (ALD) based process that can form a conformal and/or continuous titanium-and-nitrogen containing barrier layer. The two-step ALD-based process described herein improves adhesion of an ALD-formed titanium-and-nitrogen containing barrier layer to surfaces of the MLI feature defining the contact opening, thereby improving adhesion of the cobalt bulk layer to the ALD-formed titanium-and-nitrogen containing barrier layer. The improved adhesion properties have been observed to eliminate (or significantly reduce) voids in the cobalt bulk layer, preserving EM performance benefits achieved by cobalt-based interconnect structures. Different embodiments may have different advantages, and no particular advantage is required of any embodiment.

FIGS. 1A-1H are fragmentary diagrammatic views of an integrated circuit device 10, in portion or entirety, at various fabrication stages according to various aspects of the present disclosure. Integrated circuit device 10 may be included in a microprocessor, a memory, and/or other integrated circuit device. In some implementations, integrated circuit device 10 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or multi-gate transistors, such as fin-like FETs (FinFETs). FIGS. 1A-1H have been simplified for the sake of clarity to better understand the inventive concepts of the present disclosure. Additional features can be added in integrated circuit device 10, and some of the features described below can be replaced, modified, or eliminated in other embodiments of integrated circuit device 10.

Turning to FIG. 1A, integrated circuit device 10 includes a substrate (wafer) 12. In the depicted embodiment, substrate 12 includes silicon. Alternatively or additionally, substrate 12 includes another elementary semiconductor, such as germanium; a compound semiconductor, such as silicon carbide (SiC), gallium arsenide (GaAs), gallium phosphide (GaP), indium phosphide (InP), indium arsenide (InAs), and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 12 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 12 can include various doped regions (not shown) depending on design requirements of integrated circuit device 10. In some implementations, substrate 12 includes p-type doped regions (for example, p-type wells) doped with p-type dopants, such as boron (for example, $BF_2$), indium, other p-type dopant, or combinations thereof. In some implementations, substrate 12 includes n-type doped regions (for example, n-type wells) doped with n-type dopants, such as phosphorus, arsenic, other n-type dopant, or combinations thereof. In some implementations, substrate 12 includes doped regions formed with a combination of p-type dopants and n-type dopants. The various doped regions can be formed directly on and/or in substrate 12, for example, providing a p-well structure, an n-well structure, a dual-well structure, a raised structure, or combinations thereof. An ion implantation process, a diffusion process, and/or other suitable doping process can be performed to form the various doped regions.

Isolation feature(s) 14 are formed over and/or in substrate 12 to isolate various regions, such as various device regions, of integrated circuit device 10. For example, isolation features 14 define and electrically isolate active device regions and/or passive device regions from each other. Isolation features 14 include silicon oxide, silicon nitride, silicon oxynitride, other suitable isolation material (for example, including silicon, oxygen, nitrogen, carbon, or other suitable isolation constituent), or combinations thereof. Isolation features 14 can include different structures, such as shallow trench isolation (STI) structures, deep trench isolation (DTI) structures, and/or local oxidation of silicon (LOCOS) structures. In some implementations, isolation features 14 are formed by etching a trench in substrate 12 (for example, using a dry etch process and/or wet etch process) and filling the trench with insulator material (for example, using a chemical vapor deposition (CVD) process or a spin-on glass process). A chemical mechanical polishing (CMP) process may be performed to remove excessive insulator material and/or planarize a top surface of isolation features 14. In some embodiments, isolation features 14 can be formed by depositing an insulator material over substrate after forming fins (in some implementations, such that the insulator material layer fills gaps (trenches) between the fins) and etching back the insulator material layer. In some implementations, isolation features 14 include a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation features 14 include a dielectric layer disposed over a doped liner layer (including, for example, boron silicate glass (BSG) or phosphosilicate glass (PSG)).

A gate structure 20 is disposed over substrate 12. Gate structure 20 interposes a source region and a drain region, where a channel region is defined between the source region and the drain region. Gate structure 20 engages the channel region, such that current can flow between the source/drain regions during operation. In some implementations, gate structure 20 is formed over a fin structure, such that gate structure 20 wraps a portion of the fin structure. For example, gate structure 20 wraps a channel region of the fin structure, thereby interposing a source region and a drain region of the fin structure. Gate structure 20 includes a gate stack 22 that is configured to achieve desired functionality according to design requirements of integrated circuit device 10. In some implementations, gate stack 22 includes a gate dielectric (for example, a gate dielectric layer) and a gate electrode (for example, a work function layer and/or a bulk conductive layer). Gate stack 22 may include numerous other layers, for example, capping layers, interfacial layers, diffusion layers, barrier layers, hard mask layers, or combinations thereof. In some implementations, the gate dielectric layer is disposed over an interfacial layer (including a dielectric material, such as silicon oxide), and the gate electrode is disposed over the gate dielectric layer. The gate dielectric layer includes a dielectric material, such as silicon oxide, high-k dielectric material, other suitable dielectric material, or combinations thereof. Examples of high-k dielectric material include hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In some implementations, the gate dielectric layer is a high-k dielectric layer. The gate electrode includes a conductive material, such as polysilicon, aluminum (Al), copper (Cu), titanium (Ti), tantalum (Ta), tungsten (W), molybdenum (Mo), cobalt (Co), TaN, NiSi, CoSi, TiN, WN, TiAl, TiAlN, TaCN, TaC, TaSiN, other conductive material, or combinations thereof. In some implementations, the work function layer is a conductive layer tuned to have a desired work function (such as an n-type work function or a p-type work function), and the conductive bulk layer is a conductive layer formed over the work function layer. In some implementations, the work function layer includes n-type work function materials, such as Ti, silver (Ag), TaAl, TaAlC, TiAlN, TaC, TaCN, TaSiN, manganese (Mn), zirconium (Zr), other suitable n-type work function materials, or combinations thereof. In some implementations, the work function layer includes a p-type work function material, such as TiN, TaN, ruthenium (Ru), Mo, Al, WN, $ZrSi_2$, $MoSi_2$, $TaSi_2$, $NiSi_2$, WN, other suitable p-type work function materials, or combinations thereof. The bulk (or fill) conductive layer includes a suitable conductive material, such as Al, W, and/or Cu. The bulk conductive layer may additionally or collectively include polysilicon, Ti, Ta, metal alloys, other suitable materials, or combinations thereof. The present disclosure further contemplates embodiments where the gate dielectric layer, the work function layer, the bulk conductive layer, and/or other layer of gate stack 22 has a multi-layer structure.

Gate stack 22 is formed by deposition processes, lithography processes, etching processes, other suitable processes, or combinations thereof. The deposition processes include CVD, physical vapor deposition (PVD), ALD, high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, electron-beam writing, or ion-beam writing. The etching processes include dry etching processes, wet etching processes, other etching processes, or combinations thereof. Gate stack 22 is fabricated according to a gate last process, a gate first process, or a hybrid gate last/gate first process. In gate last process implementations, gate structure 20 includes a dummy gate stack that is subsequently replaced with a metal gate stack. The dummy gate stack includes, for example, an interfacial layer (including, for example, silicon oxide) and a dummy gate electrode layer (including, for example, polysilicon). In such implementations, the dummy gate electrode layer is removed, thereby forming an opening (trench) in which the metal gate stack including various layers described above is formed.

Gate structure 20 further includes gate spacers 24, which are disposed adjacent to (for example, along sidewalls of) gate stack 22, respectively. Gate spacers 24 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 12 and subsequently anisotropically etched to form gate spacers 24. In some implementations, gate spacers 24 include a multi-layer structure, such as a first dielectric layer that includes silicon nitride and a second dielectric layer that includes silicon oxide. In some implementations, more than one set of spacers, such as seal spacers, offset spacers, sacrificial spacers, dummy spacers, and/or main spacers, are formed adjacent to gate stack 22. In such implementations, the various sets of spacers can include materials having different etch rates. For example, a first dielectric layer including silicon and oxygen (for example, silicon oxide) can be deposited over substrate 12 and subsequently anisotropically etched to form a first spacer set adjacent to gate stack 22, and a second dielectric layer including silicon and nitrogen (for example, silicon nitride) can be deposited over substrate 12 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features in substrate 12 before and/or after forming gate spacers 24, depending on design requirements of integrated circuit device 10.

Epitaxial source features and epitaxial drain features (referred herein to as epitaxial source/drain features) are disposed in source/drain regions of substrate 12. For example, a semiconductor material is epitaxially grown on substrate 12, forming epitaxial source/drain features 28 in a source region and a drain region of substrate 12. In the depicted embodiment, gate structure 20 interposes epitaxial source/drain features 28, and a channel region is defined in substrate 12 between epitaxial source/drain features 28. Gate structure 20 and epitaxial source/drain features 28 thus form a portion of a transistor. In some implementations, epitaxial source/drain features 28 wrap source/drain regions of a fin structure. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of substrate 12. Epitaxial source/drain features 28 are doped with n-type dopants and/or p-type dopants. For example, where the transistor is configured as an n-type device (for example, having an n-channel), epitaxial source/drain features 28 are epitaxial layers including silicon and/or carbon, where silicon-containing epitaxial layers or silicon-carbon-containing epitaxial layers are doped with phosphorous, other n-type dopant, or combinations thereof (for example, forming a Si:P epitaxial layer or a Si:C:P epitaxial layer). In another example, where the transistor is configured as a p-type device (for example, having a p-channel), epitaxial source/drain features 28 are epitaxial layers including silicon and germanium, where the silicon germanium containing epitaxial layers are doped with boron, other p-type dopant, or combinations thereof (for example, forming a Si:Ge:B epitaxial layer). In some implementations, epitaxial source/drain features 28 include materials and/or dopants that achieve desired tensile stress and/or compressive stress in the channel region. In some implementations, epitaxial source/drain features 28 are doped during deposition by adding impurities to a source material of the epitaxy process. In some implementations, epitaxial source/drain features 28 are doped by an ion implantation process subsequent to a deposition process. In some implementations, annealing processes are performed to activate dopants in epitaxial source/drain features 28 and/or other source/drain regions (for example, HDD regions and/or LDD regions disposed in substrate 12 and/or epitaxial source/drain features 28).

An ILD layer 30 is disposed over substrate 12. ILD layer 30 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In some implementations, ILD layer 30 has a multilayer structure having multiple dielectric materials. In some implementations, a contact etch stop layer (CESL) is disposed between ILD layer 30 and substrate 12. The CESL includes a material different than ILD layer 30, such as a dielectric material that is different than the dielectric material of ILD layer 30. In the depicted embodiment, where ILD layer 30 includes a low-k dielectric material, the CESL includes silicon and nitrogen (for example, silicon nitride or silicon oxynitride). ILD layer 30 and/or the CESL are formed over substrate 12, for example, by a deposition process (such as CVD, PVD, ALD, HDPCVD, MOCVD, RPCVD, PECVD, LPCVD, ALCVD, APCVD, plating, other suitable methods, or combinations thereof). In some implementations, ILD layer 30 and/or the CESL are formed by a flowable CVD (FCVD) process that includes, for example, depositing a flowable material (such as a liquid compound) over substrate 12 and converting the flowable material to a solid material by a suitable technique, such as thermal annealing and/or ultraviolet radiation treating. Subsequent to the deposition of ILD layer 30 and/or the CESL, a CMP process and/or other planarization process is performed, such that a top portion of gate structure 20 is reached (exposed). In the depicted embodiment, a top surface of gate stack 22 is substantially planar with a top surface of ILD layer 30.

Figure 1B:
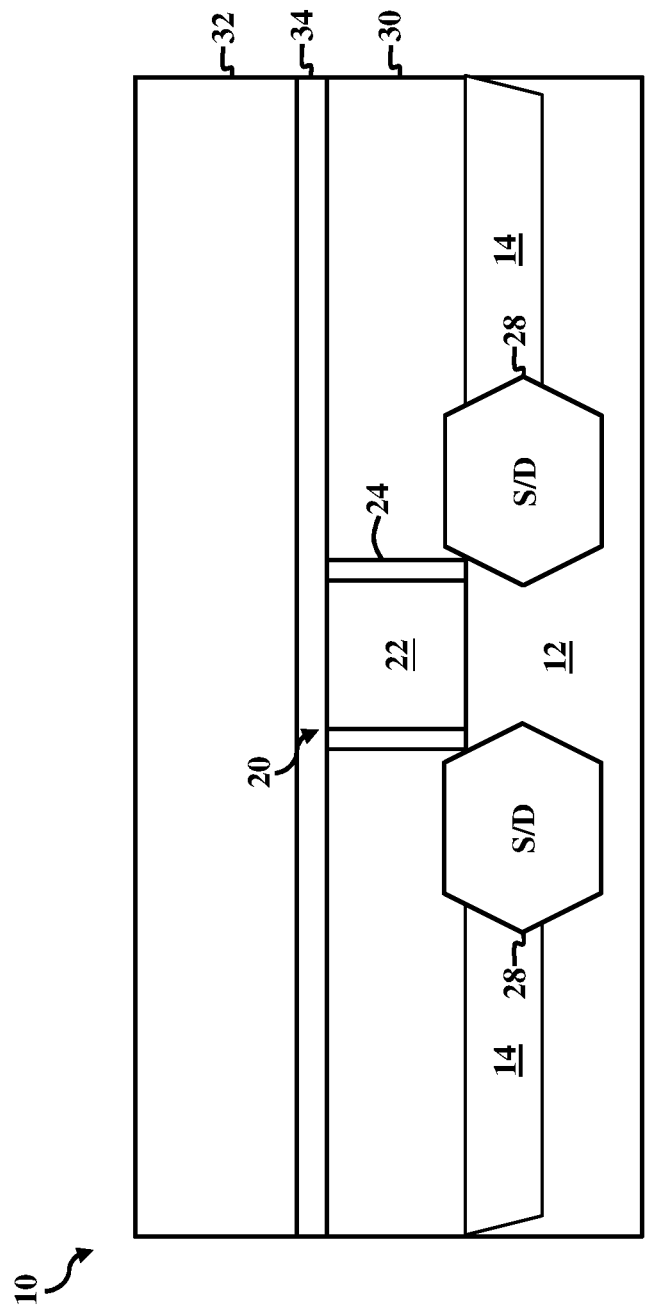

Turning to FIG. 1B, an ILD layer 32 is formed over ILD layer 30. ILD layer 32 is similar to ILD layer 30. For example, ILD layer 32 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In some implementations, ILD layer 32 has a multilayer structure having multiple dielectric materials. In the depicted embodiment, a CESL 34 is formed over ILD layer 30 before forming ILD layer 32, such that CESL 34 is disposed between ILD layer 30 and ILD layer 32. CESL 34 includes a material different than ILD layer 32, such as a dielectric material that is different than the dielectric material of ILD layer 32. In the depicted embodiment, where ILD layer 32 includes a low-k dielectric material, CESL 34 includes silicon and nitrogen (for example, silicon nitride or silicon oxynitride). ILD layer 32 and/or CESL 34 are formed over substrate 12, for example, by a deposition process (such as CVD, PVD, ALD, HDPCVD, MOCVD, RPCVD, PECVD, LPCVD, ALCVD, APCVD, plating, other suitable methods, or combinations thereof). In some implementations, ILD layer 32 and/or CESL 34 are formed by an FCVD process. Subsequent to the deposition of ILD layer 32 and/or CESL 34, a CMP process and/or other planarization process is performed.

Figure 1C:
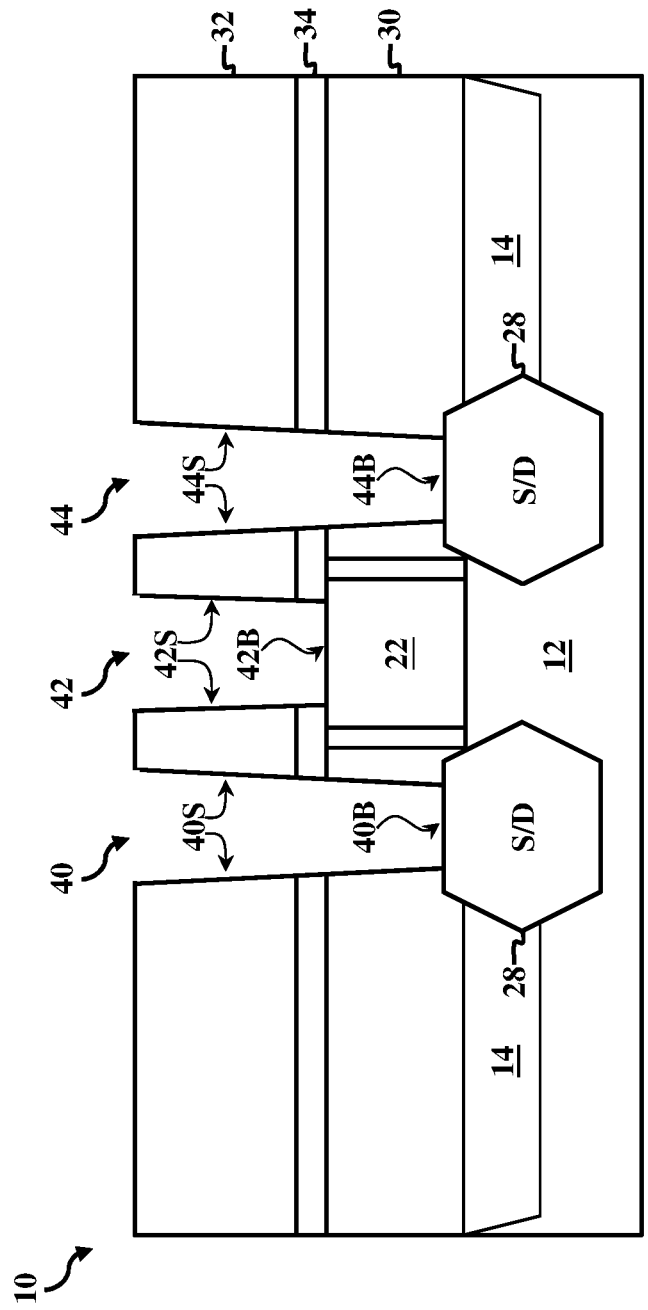

Turning to FIG. 1C, one or more contact openings are formed in ILD layer 30 and/or ILD layer 32 (and, in some implementations, CESL 34) by a patterning process, such as a contact opening 40, a contact opening 42, and a contact opening 44. In the depicted embodiment, contact opening 40 extends vertically through ILD layer 32, CESL 34, and ILD layer 30, exposing epitaxial source/drain feature 28; contact opening 42 extends vertically through ILD layer 32 and CESL 34, exposing gate structure 20 (in particular, gate stack 22); and contact opening 44 extends vertically through ILD layer 32, CESL 34, and ILD layer 30, exposing epitaxial source/drain feature 28. Contact opening 40 includes sidewalls 40S (defined by ILD layer 32, CESL 34, and ILD layer 30) and a bottom 40B (defined by epitaxial source/drain feature 28) that extends between sidewalls 40S. Contact opening 42 includes sidewalls 42S (defined by ILD layer 32 and CESL 34) and a bottom 42B (defined by gate stack 22) that extends between sidewalls 42S. Contact opening 44 includes sidewalls 44S (defined by ILD layer 32, CESL 34, and ILD layer 30) and a bottom 44B (defined by epitaxial source/drain feature 28) that extends between sidewalls 44S. In some implementations, contact opening 40, contact opening 42, and/or contact opening 44 have a width of about 15 nm to about 20 nm and a depth (or height) of about 150 nm to about 200 nm. In some implementations, contact opening 40, contact opening 42, and/or contact opening 44 are high aspect ratio openings having a ratio of depth to width (for example, critical dimension of opening) that is about 10 to about 30.

The patterning process includes lithography processes and/or etching processes. For example, forming contact openings 40-44 includes performing a lithography process to form a patterned resist layer over ILD layer 32 and performing an etching process to transfer a pattern defined in the patterned resist layer to ILD layer 32, CESL 34, and/or ILD layer 30. The lithography process can include forming a resist layer on ILD layer 32 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed)

portions of the resist layer are dissolved during a developing process depending on characteristics of the resist layer and characteristics of a developing solution used in the developing process. After development, the patterned resist layer includes a resist pattern that corresponds with the mask. The etching process uses the patterned resist layer as an etch mask to remove portions of ILD layer 32, CESL 34, and/or ILD layer 30, thereby exposing gate structure 20 and epitaxial source/drain features 28. The etching process can include a dry etching process, a wet etching process, other suitable etching process, or combinations thereof. After the etching process, the patterned resist layer is removed from ILD layer 32, for example, by a resist stripping process. In some implementations, ILD layer 32 is used as etching mask to remove CESL 34. Various selective etching processes can be performed to remove ILD layer 32, CESL 34, and/or ILD layer 30 when forming contact openings 40-44. Alternatively, the exposure process can be implemented or replaced by other methods, such as maskless lithography, electron-beam writing, ion-beam writing, and/or nanoimprint technology.

Figure 1D:
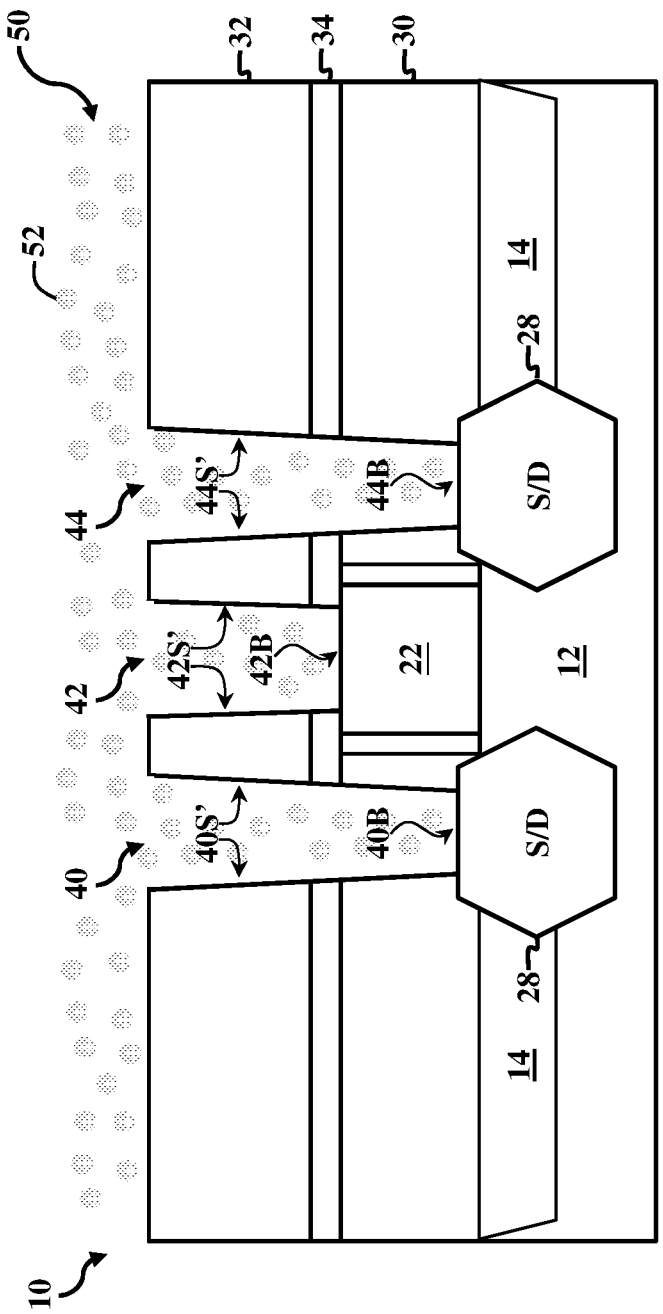

Turning to FIG. 1D, an ALD-like nitrogen-containing plasma pre-treatment process 50 is performed on contact openings 40-44. In the depicted embodiment, ALD-like nitrogen-containing plasma pre-treatment process 50 is a cyclical pulse/purge process, where each ALD-like cycle includes a nitrogen-containing plasma pulse phase and a purge phase, as described further below. ALD-like nitrogen-containing plasma pre-treatment process 50 nitridizes exposed surfaces of contact openings 40-44, thereby structurally changing one or more surfaces defining contact openings 40-44. For example, during the nitrogen-containing plasma pulse, plasma-excited nitrogen-containing species 52 interact with exposed surfaces of ILD layer 30, ILD layer 32, CESL 34, and/or conductive features (such as gate stack 22 and epitaxial source/drain features 28). In the depicted embodiment, nitrogen adsorbs onto sidewalls 40S-44S during ALD-like nitrogen-containing plasma pre-treatment process 50, forming nitridized sidewalls 40S' of contact opening 40, nitridized sidewalls 42S' of contact opening 42, and nitridized sidewalls 44S' of contact opening 44. For example, in some implementations, where ILD layer 30 and/or ILD layer 32 include silicon and oxygen (for example, silicon oxide ($SiO_x$)), nitrogen interacts with silicon and oxygen, such that nitridized sidewalls 40S'-44S' include silicon, oxygen, and nitrogen (for example, $SiO_x$ is nitridized into SiON at exposed surfaces of ILD layer 30 and/or ILD layer 32). Nitridized sidewalls 40S'-44S' significantly improve adhesion of a titanium-and-nitrogen containing barrier layer subsequently deposited in contact openings 40-44. In some implementations, plasma-excited nitrogen-containing species 52 interact with bottoms 40B-44B respectively of contact openings 40-44, such that ALD-like nitrogen-containing plasma pre-treatment process 50 produces nitridized bottoms (not shown).

Figure 2:
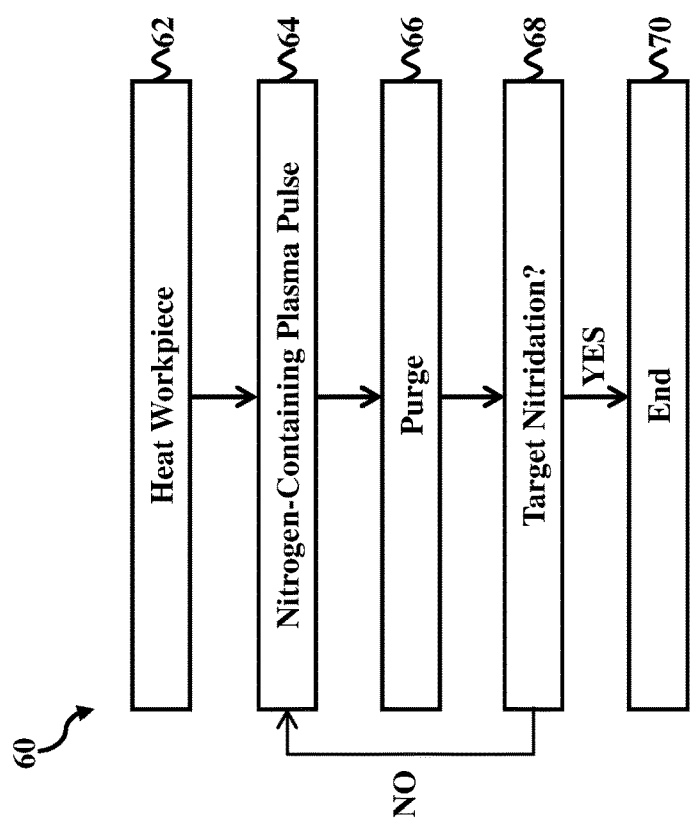
FIG. 2 is a flow chart of an ALD-like nitrogen plasma pre-treatment process, which can be implemented in FIG. 1D, according to various aspects of the present disclosure.

FIG. 2 is a flow chart of an ALD-like nitrogen plasma pre-treatment process 60, which can be implemented as ALD-like nitrogen-containing plasma pre-treatment process 50 in FIG. 1D, according to various aspects of the present disclosure. At block 62, a workpiece is loaded into an ALD chamber, where the ALD chamber is prepared for an ALD-like nitrogen plasma pre-treatment process. For example, integrated circuit device 10 is loaded into an ALD chamber, where integrated circuit device 10 is heated to a desired temperature. In some implementations, a temperature maintained in the ALD chamber is about 300° C. to about 400° C. In some implementations, integrated circuit device 10 is heated to a temperature of about 300° C. to about 400° C. In some implementations, a pressure in the ALD chamber is set to about 0.5 torr to about 5 torr. At block 64, the workpiece is exposed to nitrogen-containing plasma (which is referred to as a nitrogen-containing plasma pulse). The nitrogen-containing plasma nitridizes exposed surfaces of integrated circuit device 10. In some implementations, the nitrogen-containing plasma nitridizes exposed features of integrated circuit device 10 that include a dielectric material (for example, ILD layers). At block 66, a purge process is performed to remove any remaining nitrogen-containing plasma and any byproducts from the ALD chamber. Block 64 and block 66 constitute one ALD-like cycle, which includes one nitrogen-containing plasma pulse phase (block 64) and one purge phase (block 66). The ALD-like cycle is repeated until reaching desired surface nitridation of sidewalls 40S-44S and/or bottoms 40B-44B, such that contact openings 40-44 are defined by nitridized sidewalls 40S'-44S' and/or nitridized bottoms. For example, at block 68, if treated surfaces of integrated circuit device 10 exhibit conformal nitridized surfaces, then ALD-like nitrogen plasma pre-treatment process 60 ends at block 70. If a portion of the treated surfaces of integrated circuit device 10 are not nitridized (for example, where ILD layer 30 and/or ILD layer 32 include silicon and oxygen and a portion of sidewalls 40S, sidewalls 42S, and/or sidewalls 44S does not include silicon, oxygen, and nitrogen), then ALD-like nitrogen plasma pre-treatment process 60 returns to block 64 to begin another ALD-like cycle. In some implementations, about 15 ALD-like cycles to about 30 ALD-like cycles are performed to sufficiently nitridize surfaces of contact openings 40-44, thereby improving adhesion of a subsequently deposited titanium-and-nitrogen containing barrier layer. Additional steps can be provided before, during, and after ALD-like nitrogen plasma pre-treatment process 60, and some of the steps described can be moved, replaced, or eliminated for additional embodiments of ALD-like nitrogen plasma pre-treatment process 60.

In the depicted embodiment, the nitrogen-containing plasma is generated from a nitrogen-containing gas, such as diatomic nitrogen ($N_2$). ALD-like nitrogen plasma pre-treatment process 60 can thus be referred to as an $N_2$ plasma pre-treatment process. In such implementations, the nitrogen-containing plasma includes nitrogen-containing excited neutral molecules (for example, $N_2^*$), nitrogen-containing ionized molecules (for example, $N_2^+$), nitrogen-containing atoms (for example, N), ionized atoms ($N^+$), or combinations thereof (all generally referred to as plasma-excited nitrogen-containing species 52). In some implementations, a flow rate of the nitrogen-containing gas (such as $N_2$) is about 1,500 sccm to about 3,000 sccm. In some implementations, a power used to generate the nitrogen-containing plasma is about 2,500 W to about 3,500 W. In some implementations, the nitrogen-containing plasma is generated by a radio frequency (RF) power source, such that the power is RF power. In some implementations, the nitrogen-containing plasma pulse duration is about 5 seconds to about 15 seconds. In some implementations, a pressure maintained in the ALD chamber during the nitrogen-containing plasma pulse is about 0.5 torr to about 1 torr (for example, about 0.6 torr). In some implementations, a temperature maintained in the ALD chamber during the nitrogen-containing plasma pulse is about 300° C. to about 400° C.

In furtherance of the depicted embodiment, the purge process can remove any remaining nitrogen-containing plasma (here, $N_2$ plasma) and various nitrogen-containing byproducts, such as $N_2O$, NO, other nitrogen-containing byproducts, or combinations thereof, from the ALD chamber. The purge process implements an inert gas, such as an argon-containing gas, a helium-containing gas, other suitable inert gas, or combinations thereof. For example, in the depicted embodiment, the purge process introduces an argon-containing gas, such as Ar, into the ALD chamber. In some implementations, a flow rate of the inert gas is about 1,000 sccm to about 3,000 sccm. In some implementations, the purge process duration is about 5 seconds to about 15 seconds. In some implementations, duration of the purge process and the nitrogen-containing plasma pulse is about the same (for example, about 5 seconds). In some implementations, a pressure maintained in the ALD chamber during the purge process is about 0.5 torr to about 5 torr. In some implementations, a pressure maintained in the ALD chamber during the purge process is greater than a pressure maintained in the ALD chamber during the nitrogen-containing plasma pulse. For example, a pressure maintained in the ALD chamber during the purge process is about 3 torr to about 4 torr, while a pressure maintained in the ALD chamber during the nitrogen-containing plasma pulse is about 0.5 torr to about 1 torr.

Figure 1E:
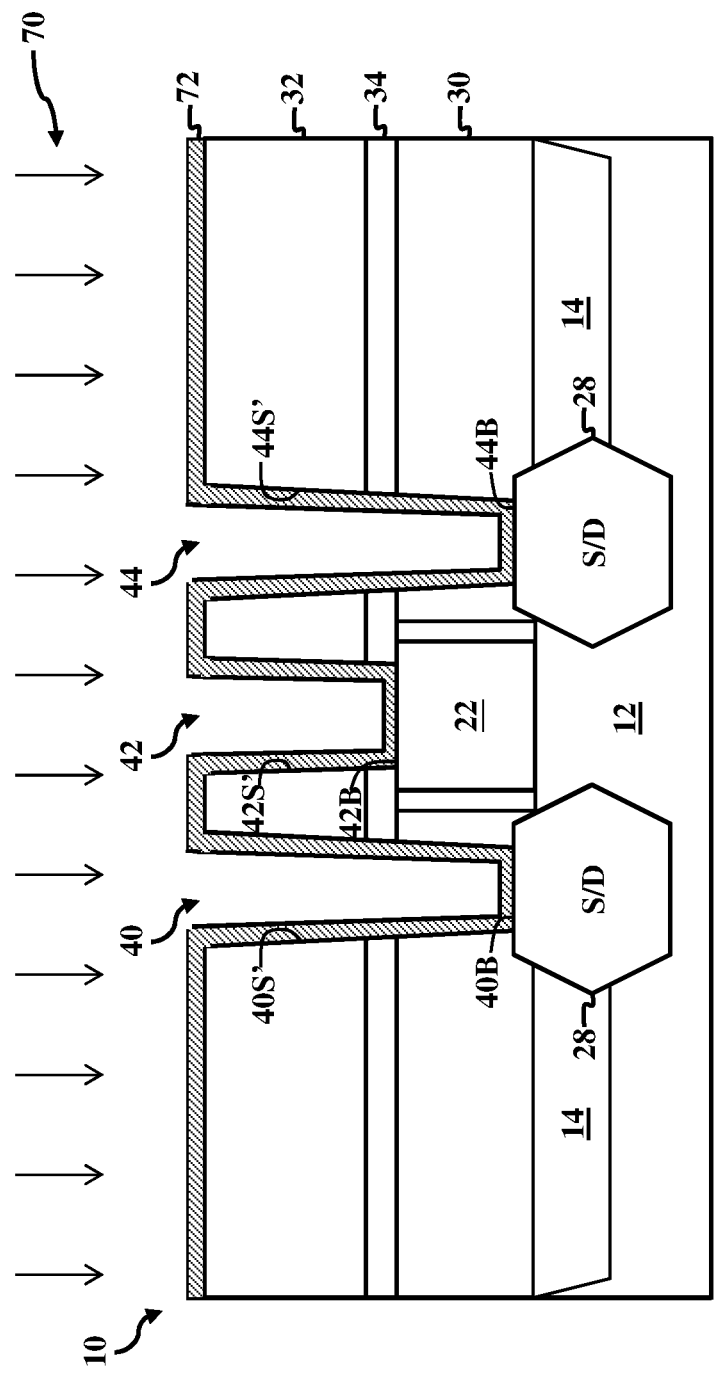

Turning to FIG. 1E, an ALD process 70 is performed to form a contact barrier layer 72 in contact openings of integrated circuit device 10, such as contact openings 40-44. For example, ALD process 70 conformally deposits contact barrier layer 72 over integrated circuit device 10, such that contact barrier layer 72 has a substantially uniform thickness and partially fills contact openings 40-44. In the depicted embodiment, contact barrier layer 72 is disposed on nitridized sidewalls 40S'-44S' and bottoms 40B-44B of contact openings 40-44, such that contact barrier layer 72 is disposed on ILD layer 30, ILD layer 32, CESL 34, and/or conductive features of integrated circuit device 10 (for example, gate stack 22 and/or epitaxial source/drain features 28). In some implementations, contact barrier layer 72 has a thickness of about 10 Å to about 30 Å. In furtherance of the depicted embodiment, contact barrier layer 72 is a titanium-and-nitrogen containing layer, such as a TiN layer. Nitridized sidewalls 40S'-44S' enhance adhesion of contact barrier layer 72, such that contact barrier layer 72 extends conformally and/or continuously along nitridized sidewalls 40S'-44S' and bottoms 40B-44B. In some implementations, contact barrier layer 72 is free of voids.

Figure 3:
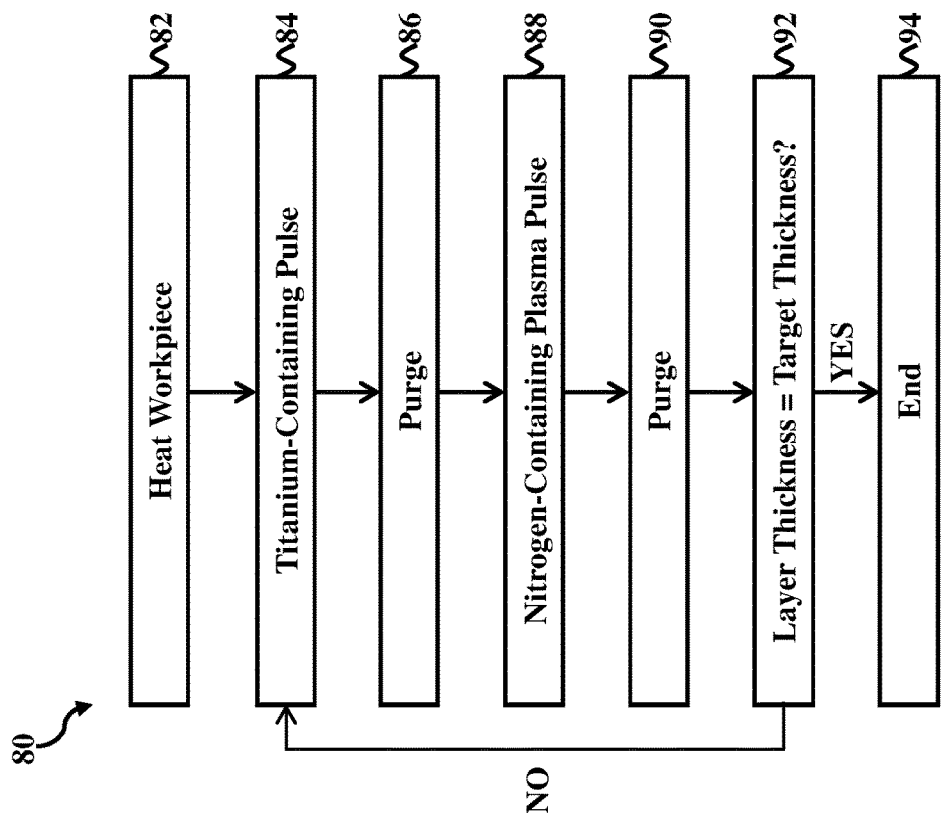
FIG. 3 is a flow chart of an ALD process, which can be implemented in FIG. 1E, according to various aspects of the present disclosure.

FIG. 3 is a flow chart of an ALD process 80, which can be implemented as ALD process 70 in FIG. 1E, according to various aspects of the present disclosure. At block 82, a workpiece is loaded into an ALD chamber, where the ALD chamber is prepared for an ALD process to form a contact barrier layer, such as contact barrier layer 72. For example, integrated circuit device 10 is loaded into an ALD chamber, where integrated circuit device 10 is heated to a desired temperature. In some implementations, a temperature maintained in the ALD chamber is about 300° C. to about 400° C. In some implementations, a pressure in the ALD chamber is set to about 0.5 torr to about 5 torr. At block 84, the workpiece is exposed to a titanium-containing precursor (which can be referred to as a titanium-containing pulse). At block 86, a purge process is performed to remove any remaining titanium-containing precursor and any byproducts from the ALD chamber. At block 88, the workpiece is exposed to a nitrogen-containing plasma (which can be referred to as a nitrogen-containing plasma pulse). At block 90, a purge process is performed to remove any remaining nitrogen-containing plasma and any byproducts from the ALD chamber. Blocks 84-90 constitute one ALD cycle, which includes two deposition phases (block 84 and block 88) and two purge phases (block 86 and block 90). Each ALD cycle is a self-limiting process, where less than or equal to about one titanium-and-nitrogen containing monolayer is deposited during each ALD cycle. The ALD cycle is repeated until a contact barrier layer, such as contact barrier layer 72, reaches a desired (target) thickness. For example, at block 92, if a thickness of contact barrier layer 72 equals a target thickness (or is within a given threshold of the target thickness), then ALD process 90 ends at block 94. If the thickness of contact barrier layer 72 does not equal the target thickness (or is not within the given threshold of the target thickness), then ALD process 80 returns to block 74 to begin another ALD cycle. In some implementations, the ALD cycle (blocks 84-90) is repeated until contact barrier layer 72 has a thickness of about 10 Å to about 30 Å. Additional steps can be provided before, during, and after ALD process 80, and some of the steps described can be moved, replaced, or eliminated for additional embodiments of ALD process 80.

In the depicted embodiment, the titanium-containing precursor at block 84 includes tetrakis(dimethylamino)titanium (TDMAT) (for example, $(Ti[N(CH_3)_2]_4)$. In such implementations, during the titanium-containing pulse, titanium, nitrogen, carbon, and/or hydrogen adsorb onto nitridized sidewalls 40S'-44S' and bottoms 40B-44B to form a layer that includes titanium, nitrogen, carbon, and/or hydrogen (for example, $TiNC_xH_z$). In some implementations, the titanium-containing precursor can include tetrakis(diethylamido)titanium (TDEAT), tetrakis(ethylmethylamino)titanium (TEMAT), titanium tetrachloride (TiCl$_4$) or other suitable titanium-containing precursor. In some implementations, a flow rate of the titanium-containing precursor is about 500 sccm to about 1,000 sccm. In some implementations, a carrier gas is used to deliver the titanium-containing precursor to the ALD chamber. In some implementations, the carrier gas is an inert gas, such as an argon-containing gas, a helium-containing gas, other suitable inert gas, or combinations thereof. In some implementations, the titanium-containing pulse duration is about 5 seconds to about 15 seconds. In some implementations, a pressure maintained in the ALD chamber during the titanium-containing pulse duration is about 0.5 torr to about 5 torr. In some implementations, a temperature maintained in the ALD chamber during the titanium-containing pulse duration is the same as a temperature maintained in the ALD chamber during ALD-like nitrogen-containing plasma pre-treatment 50 (for example, about 300° C. to about 400° C.).

In furtherance of the depicted embodiment, the purge process at block 86 can remove any remaining titanium-containing precursor and various hydrocarbon-containing byproducts, such as $HN(CH_3)_2$, $H_2NCH_3$, other hydrocarbon-containing byproducts, or combinations thereof, from the ALD chamber. The purge process implements an inert gas, such as an argon-containing gas, a helium-containing gas, other suitable inert gas, or combinations thereof. For example, in the depicted embodiment, the purge process implements an argon-containing gas, such as Ar. In some implementations, a flow rate of the inert gas is about 1,500 sccm to about 3,000 sccm. In some implementations, the purge process duration is about 5 seconds to about 15 seconds. In some implementations, duration of the purge process and the titanium-containing pulse is about the same amount of time. In some implementations, a pressure maintained in the ALD chamber during the purge process is about 1 torr to about 5 torr.

In furtherance of the depicted embodiment, the nitrogen-containing plasma at block 88 is generated from a nitrogen-containing gas, such as $N_2$. In such implementations, the nitrogen-containing plasma includes nitrogen-containing excited neutral molecules (for example, $N_2^*$), nitrogen-containing ionized molecules (for example, $N_2^+$), nitrogen-containing atoms (for example, N), ionized atoms ($N^+$), or combinations thereof (all generally referred to as plasma-excited nitrogen-containing species). The plasma-excited nitrogen-containing species interact with the layer that includes titanium, nitrogen, carbon, and/or hydrogen (for example, $TiNC_yH_z$), thereby forming less than or equal to about one monolayer (also referred to as an atomic layer) that includes titanium and nitrogen (for example, nitrogen adsorbs onto the layer including titanium, nitrogen, carbon, and/or hydrogen, such that $TiNC_yH_z$ is nitridized into TiN). In some implementations, a flow rate of the nitrogen-containing gas (such as $N_2$) is about 1,500 sccm to about 3,000 sccm (for example, about 2,000 sccm). In some implementations, a power used to generate the nitrogen-containing plasma is about 2,000 W to about 4,000 W (for example, about 3,000 W). In some implementations, the nitrogen-containing plasma is generated by RF power source, such that the power is RF power. In some implementations, the nitrogen-containing plasma pulse duration is about 5 seconds to about 15 seconds. In some implementations, a pressure maintained in the ALD chamber during the nitrogen-containing plasma pulse is about 0.5 torr to about 1 torr. In some implementations, a temperature maintained in the ALD chamber during the nitrogen-containing plasma pulse is about 300° C. to about 400° C.

In furtherance of the depicted embodiment, the purge process at block 90 can remove any remaining nitrogen-containing plasma (here, $N_2$ plasma) and various hydrocarbon-containing byproducts, such as $CH_2E_6$, $CH_3N$, other hydrocarbon-containing byproducts, or combinations thereof, from the ALD chamber. The purge process implements an inert gas, such as an argon-containing gas, a helium-containing gas, other suitable inert gas, or combinations thereof. For example, in the depicted embodiment, the purge process implements an argon-containing gas, such as Ar. In some implementations, a flow rate of the inert gas is about 1,500 sccm to about 3,000 sccm. In some implementations, the purge process duration is about 3 seconds to about 10 seconds. In some implementations, duration of the purge process and the nitrogen-containing plasma pulse is about the same. In some implementations, a pressure maintained in the ALD chamber during the purge process is about 3 torr to about 5 torr.

Sometimes, during processing, exposed surfaces of integrated circuit device 10 may be altered when exposed to external ambient as integrated circuit device 10 is transferred between processing systems and/or processing chambers. For example, nitridized sidewalls 40S'-44S' may be undesirably oxidized when exposed to oxygen ambient, which can degrade the enhanced adhesion properties of nitridized sidewalls 40S'-44S'. To minimize such occurrences, in some implementations, ALD-like nitrogen-containing plasma pre-treatment process 50 and ALD process 70 are performed "in-situ," which generally refers to performing ALD-like nitrogen-containing plasma pre-treatment process 50 and ALD process 70 on integrated circuit device 10 in different chambers within the same IC processing system or IC processing tool, allowing integrated circuit device 10 to remain under vacuum conditions during ALD-like nitrogen-containing plasma pre-treatment process 50 and ALD process 70. As such, "in-situ" also generally refers to performing ALD-like nitrogen-containing plasma pre-treatment process 50 and ALD process 70 without exposing integrated circuit device 10 to an external ambient (for example, external to an IC processing system).

Figure 1F:
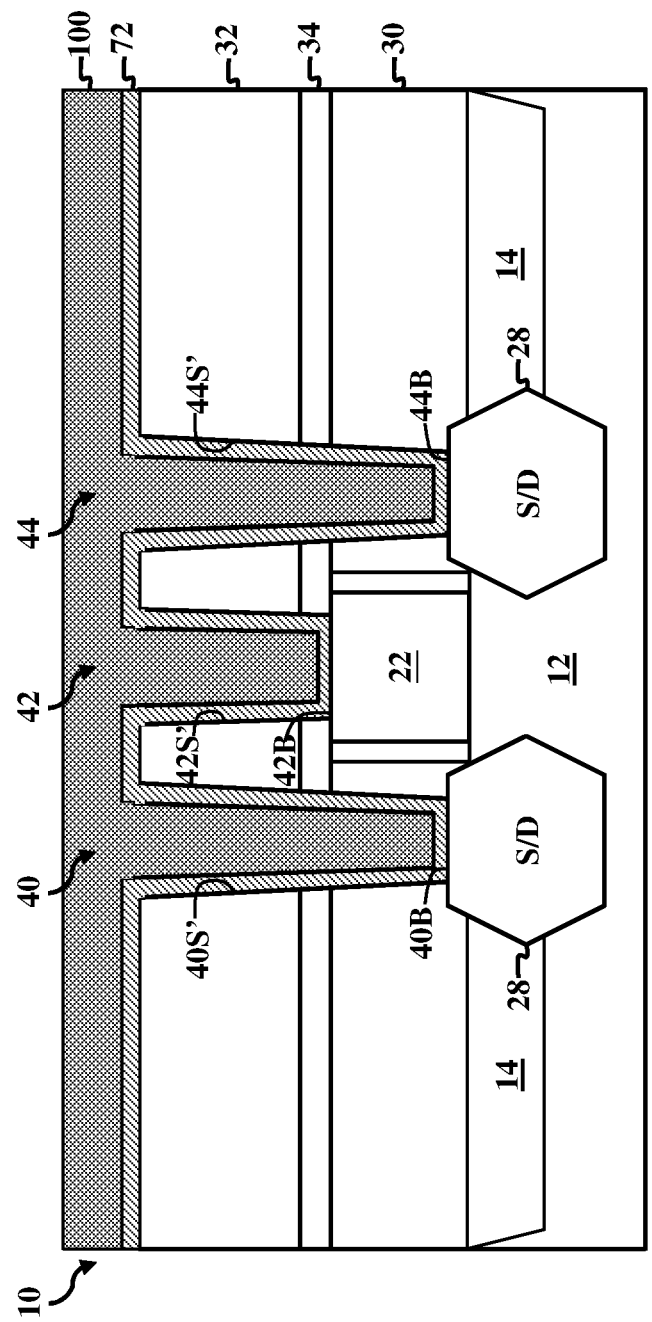

Turning to FIG. 1F, a contact bulk (fill) layer 100 is formed in contact openings of integrated circuit device 10, such as contact openings 40-44, by any suitable deposition process (for example, PVD, CVD, ALD, electroplating, electroless plating, other suitable deposition process, or combinations thereof). Contact bulk layer 100 fills any remaining contact openings 40-44. In the depicted embodiment, contact bulk layer 100 is disposed on contact barrier layer 72. In some implementations, a thickness of contact bulk layer 100 is about 1,500 Å to about 3,000 Å. In furtherance of the depicted embodiment, contact bulk layer 100 is a cobalt-containing bulk layer formed, for example, by a PVD or CVD process. In some implementations, the cobalt-containing bulk layer includes at least 50% cobalt. In some implementations, the deposition process for forming the cobalt-containing bulk layer uses a cobalt-containing precursor, such as cyclopentadienyl cobalt dicarbonyl ($CpCo(CO)_2$), dicobalt hexcarbonyl tertbutylacetylene (CCTBA), cobalt tricarbonyl nitrosyl ($Co(CO)_3NO$), bis(cyclopentadienyl)cobalt ($Co(C_5H_5)_2, CpCo(CO)_2$), bis(ethylcyclopentadienyl)cobalt ($C_{14}H_{18}Co$), bis(pentamethylcyclopentadienyl)cobalt ($C_{20}H_{30}Co$), cobalt tris(2,2,6,6-tetramethyl-3,5-heptanedionate) ($Co(OCC(CH_3)_3CHCOC(CH_3)_3)_3$), bis(ethylcyclopentadienyl)cobalt ($C_{14}H_{18}Co$), other suitable cobalt precursor, or combinations thereof.

Figure 1G:
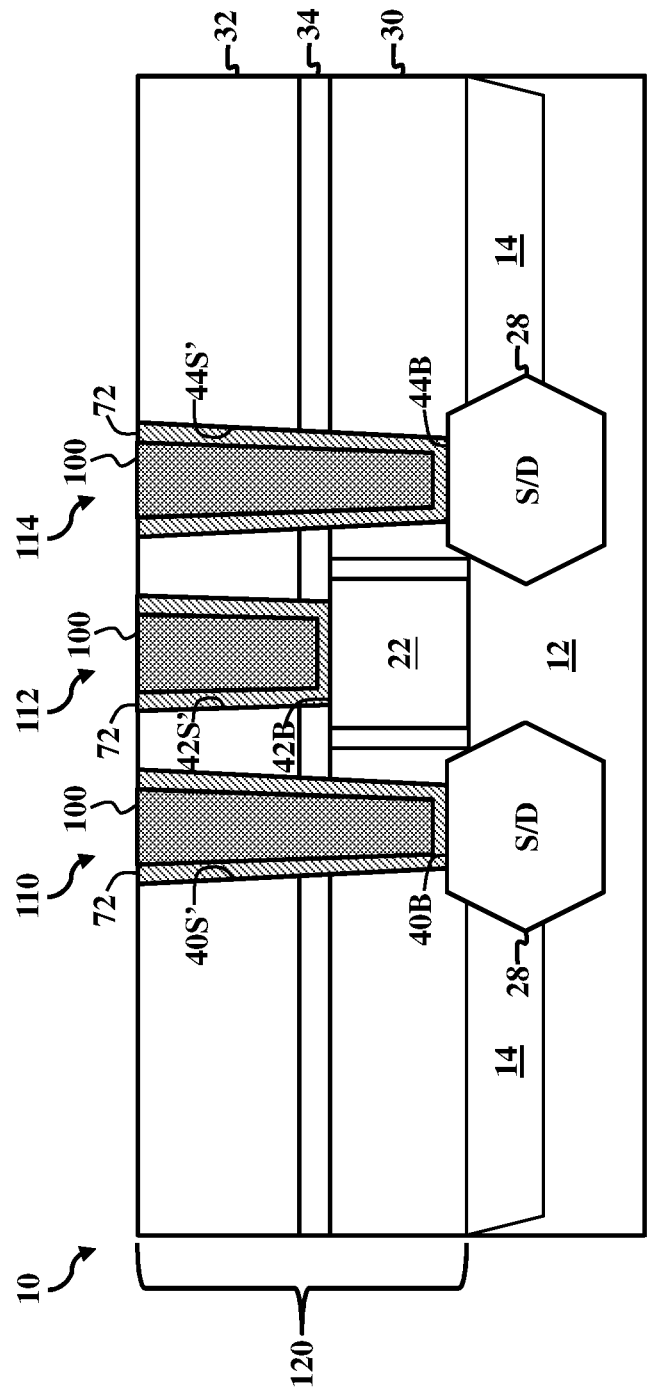

Turning to FIG. 1G, a CMP process and/or other planarization process is performed on integrated circuit device 10. The CMP process removes excessive contact barrier layer 72 and contact bulk layer 100, resulting in a contact 110, a contact 112, and a contact 114 (which respectively fill contact opening 40, contact opening 42, and contact opening 44). In the depicted embodiment, contacts 110-114 each include contact barrier layer 72 disposed directly on nitridized surfaces of the ILD layers (here, respective nitridized sidewalls 40S'-44S') and contact bulk layer 100 disposed directly on contact barrier layer 72. Because contact barrier layer 72 is continuously and/or conformally disposed over surfaces defining contact openings 40-44 (here, ILD layer 30, ILD layer 32, CESL 34, gate stack 22, and/or epitaxial source/drain feature 28), the contact bulk layer 100 adheres better to contact barrier layer 72, eliminating (or significantly reducing) any voids in contacts 110-114. The CMP process planarizes a top surface of integrated circuit device 10, such that in some implementations, a top surface of ILD layer 32, contact 110, contact 112, and contact 114 form a substantially planar surface.

In some implementations, contacts 110-114, ILD layer 30, ILD layer 32, and CESL 34 are a portion of a multilayer interconnect (MLI) feature 120 disposed over substrate 12. MLI feature 120 electrically couples various devices (for example, transistors, resistors, capacitors, and/or inductors) and/or components (for example, gate structures and/or source/drain features) of integrated circuit device 10, such that the various devices and/or components can operate as specified by design requirements of integrated circuit device 10. MLI feature 120 includes a combination of dielectric layers (including, for example, ILD layer 30, ILD layer 32, and CESL 34) and conductive layers (including, for example, contacts 110-114) configured to form various interconnect structures. The conductive layers are configured to form vertical interconnect features, such as device-level contacts and/or via contacts, and/or horizontal interconnect features, such as conductive lines. Vertical interconnect features typically connect horizontal interconnect features in different layers (or different planes) of MLI feature 120. During operation of integrated circuit device 10, the interconnect structures are configured to route signals between the devices and/or the components of integrated circuit device 10 and/or distribute signals (for example, clock signals, voltage signals, and/or ground signals) to the devices and/or the components of integrated circuit device 10.

Figure 1H:
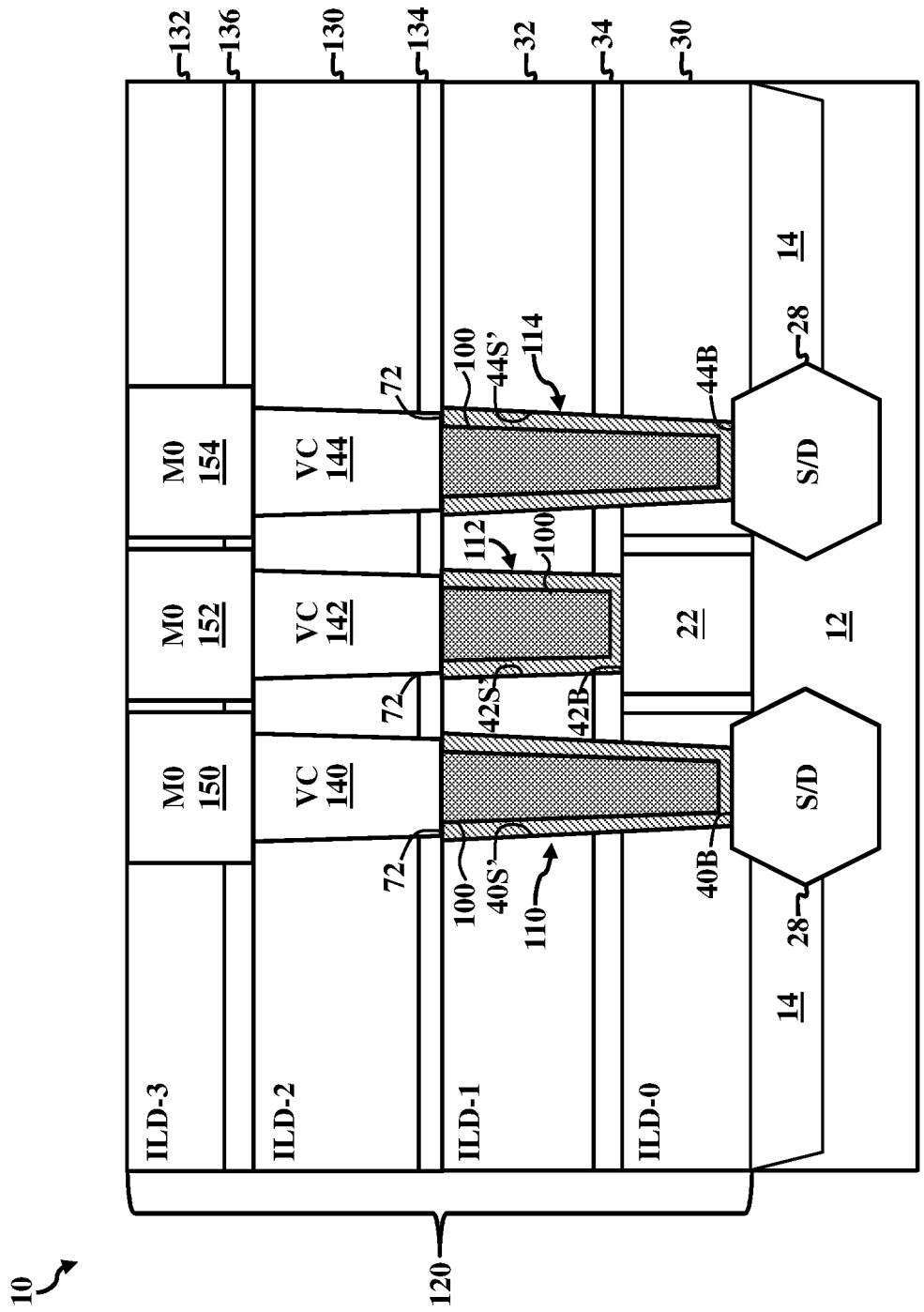

Turning to FIG. 1H, fabrication can proceed with forming additional features of MLI feature 120. For example, one or more dielectric layers, such as an ILD layer 130 and an ILD layer 132, are formed over ILD layer 32. In the depicted embodiment, ILD layer 130 is disposed over ILD layer 32 (and contacts 110-114), and ILD layer 132 is disposed over ILD layer 130. ILD layer 130 and ILD layer 132 are similar to ILD layer 30 and ILD layer 32. For example, ILD layer 130 and ILD layer 132 include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In the depicted embodiment, ILD layer 130 and ILD layer 132 are dielectric layers that include a low-k dielectric material. ILD layer 130 and/or ILD layer 132 can include a multilayer structure having multiple dielectric materials. One or more CESLs may also be formed over substrate 12, such as a CESL 134 disposed between ILD layer 32 and ILD layer 130, and a CESL 136 disposed between ILD layer 130 and ILD layer 132. CESL 134 and/or CESL 136 include a material different than ILD layer 130 and/or ILD layer 132, such as a dielectric material that is different than the dielectric material of ILD layer 130 and/or ILD layer 132. In the depicted embodiment, where ILD layer 130 and ILD layer 132 include a low-k dielectric material, CESL 134 and CESL 136 include silicon and nitrogen (for example, silicon nitride or silicon oxynitride). ILD layer 130, ILD layer 132, CESL 134, and/or CESL 136 are formed over substrate 12, for example, by a deposition process (such as CVD, PVD, ALD, HDPCVD, MOCVD, RPCVD, PECVD, LPCVD, ALCVD, APCVD, plating, other suitable methods, or combinations thereof). In some implementations, ILD layer 130, ILD layer 132, CESL 134, and/or CESL 136 are formed by an FCVD process. Subsequent to the deposition of ILD layer 130, ILD layer 132, CESL 134, and/or CESL 136, a CMP process and/or other planarization process is performed, such that ILD layer 130, ILD layer 132, CESL 134, and/or CESL 136 have substantially planar surfaces.

Various conductive features are also formed in the one or more dielectric layers, such as a via contact 140, a via contact 142, a via contact 144, a conductive line 150, a conductive line 152, and a conductive line 154. Via contacts 140-144 electrically couple and/or physically couple conductive features of MLI feature 120 to one another. For example, via contact 140 is disposed on contact 110, such that via contact 140 connects contact 110 to conductive line 150; via contact 142 is disposed on contact 112, such that via contact 142 connects contact 112 to conductive line 152; and via contact 144 is disposed on contact 114, such that via contact 144 connects contact 114 to conductive line 154. In the depicted embodiment, via contacts 140-144 extend through ILD layer 130 and CESL 134, and conductive lines 150-154 extend through ILD layer 132 and CESL 136, though the present disclosure contemplates embodiments where via contacts 140-144 and/or conductive lines 150-154 extend through more than one ILD layer and/or CESL of MLI feature 120. In some implementations, contacts 110-112 are referred to as device-level contacts (also referred to as local interconnects or local contacts), which electrically couple and/or physically couple IC device features to other conductive features of a MLI feature 120. For example, contact 112 is a metal-to-poly (MP) contact, which generally refers to a contact to a gate structure, such as a poly gate structure or a metal gate structure. In the depicted embodiment, contact 112 is disposed on gate structure 20 (in particular, gate stack 22), such that contact 112 connects gate structure 20 to via contact 142. In furtherance of the example, contact 110 and contact 114 are metal-to-device (MD) contacts, which generally refer to contacts to a conductive region of integrated circuit device 10, such as source/drain regions. In the depicted embodiment, contact 110 and contact 114 are disposed on respective epitaxial source/drain features 28, such that contact 110 and contact 114 connect epitaxial source/drain features 28 respectively to via contact 140 and via contact 144.

Via contacts 140-144 (also referred to as vertical interconnect features) and conductive lines 150-154 (also referred to as horizontal interconnect features) include any suitable conductive material, such as Ta, Ti, Al, Cu, Co, TaN, TiN, TaN, and/or other suitable conductive materials. Via contacts 140-144 and conductive lines 150-154 are formed by patterning ILD layer 130, ILD layer 132, CESL 134 and/or CESL 136. Patterning ILD layer 130, ILD layer 132, CESL 134 and/or CESL 136 can include lithography processes and/or etching processes to form openings, such as contact openings and/or line openings in respective ILD layer 130, ILD layer 132, CESL 134 and/or CESL 136. In some implementations, the lithography processes include forming a resist layer over respective ILD layer 130, ILD layer 132, CESL 134 and/or CESL 136, exposing the resist layer to patterned radiation, and developing the exposed resist layer, thereby forming a patterned resist layer that can be used as a masking element for etching opening(s) in respective ILD layer 130, ILD layer 132, CESL 134 and/or CESL 136. The etching processes include dry etching processes, wet etching processes, other etching processes, or combinations thereof. Thereafter, the opening(s) are filled with one or more conductive materials. The conductive material(s) can be deposited by PVD, CVD, ALD, electroplating, electroless plating, other suitable deposition process, or combinations thereof. Thereafter, any excess conductive material(s) can be removed by a planarization process, such as a CMP process, thereby planarizing a top surface of ILD layer 130, ILD layer 132, CESL 134 and/or CESL 136, via contacts 140-144, and/or conductive lines 150-154. In some implementations, via contacts 140-144 and/or conductive lines 150-154 includes similar materials and/or similar layers to contacts 110-114. For example, in some implementations, via contacts 140-144 and/or conductive lines 150-154 include a contact barrier layer, such as contact barrier layer 72, and a contact bulk layer, such as contact bulk layer 100, where the contact barrier layer is disposed on nitridized surfaces of the MLI feature. It is noted that though MLI feature 120 is depicted with a given number of dielectric layers and conductive layers, the present disclosure contemplates MLI feature 120 having more or less dielectric layers and/or conductive layers depending on design requirements of integrated circuit device 10.

Figure 4:
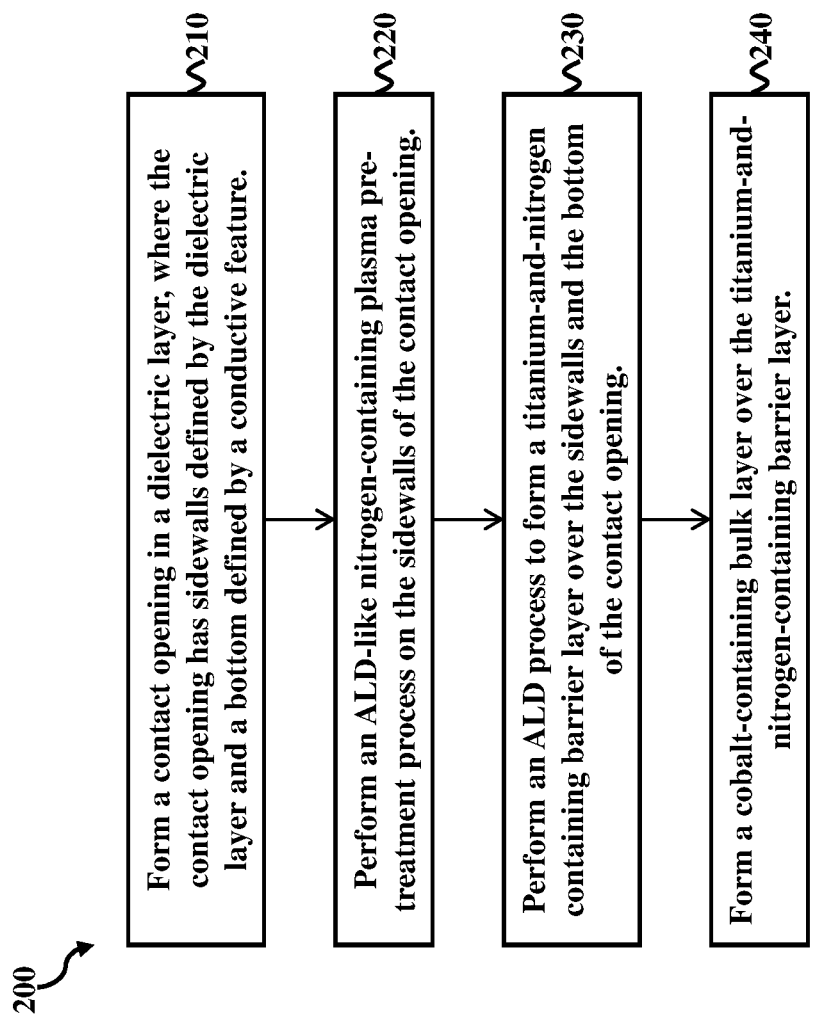
FIG. 4 is a flow chart of a method for fabricating a contact, which can be implemented in FIGS. 1A-1H, according to various aspects of the present disclosure.

FIG. 4 is a flow chart of a method 200 for fabricating a contact of an interconnect structure, such as contacts 110-114 in FIGS. 1A-1H, according to various aspects of the present disclosure. At block 210, method 200 includes forming a contact opening in a dielectric layer. The contact opening has sidewalls defined by the dielectric layer and a bottom defined by a conductive feature. At block 220, an ALD-like nitrogen-containing plasma pre-treatment process is performed on the sidewalls of the contact opening. In some implementations, the ALD-like nitrogen-containing plasma pre-treatment process is performed on the bottom of the contact opening. At block 230, an ALD process is performed to form a titanium-and-nitrogen containing barrier layer over the sidewalls and the bottom of the contact opening. In some implementations, the titanium-and-nitrogen containing barrier layer is disposed directly on treated surfaces (via the ALD-like nitrogen-containing plasma pre-treatment process) of the dielectric layer defining the contact opening. At block 240, a cobalt-containing bulk layer is formed over the titanium-and-nitrogen containing barrier layer, such that the titanium-and-nitrogen containing barrier layer and the cobalt-containing bulk layer fill the contact opening. In some implementations, the cobalt-containing bulk layer is disposed directly on the titanium-and-nitrogen containing barrier layer. Additional steps can be provided before, during, and after method 200, and some of the steps described can be moved, replaced, or eliminated for additional embodiments of method 200.

The present disclosure provides for many different embodiments. Interconnect structures and corresponding techniques for forming the interconnect structures are disclosed herein. An exemplary method includes forming a contact opening in a dielectric layer. The contact opening has sidewalls defined by the dielectric layer and a bottom defined by a conductive feature. The method further includes performing an ALD-like nitrogen-containing plasma pre-treatment process on the sidewalls (and, in some implementations, the bottom) of the contact opening. The method further includes performing an ALD process to form a titanium-and-nitrogen containing barrier layer over the sidewalls and the bottom of the contact opening. The method further includes forming a cobalt-containing bulk layer over the titanium-and-nitrogen-containing barrier layer. The titanium-and-nitrogen containing barrier layer and the cobalt-containing bulk layer fill the contact opening. In some implementations, the ALD-like nitrogen-containing plasma pre-treatment process and the ALD process are performed in-situ. In some implementations, the ALD-like nitrogen-containing plasma pre-treatment process and the ALD process are performed at substantially the same temperature.

In some implementations, a cycle of the ALD-like nitrogen-containing plasma pre-treatment process includes a nitrogen-containing plasma pulse phase and a purge phase. In some implementations, the cycle of the ALD-like nitrogen-containing plasma pre-treatment process is performed about fifteen times to about thirty times. In some implementations, a cycle of the ALD process includes a titanium-containing pulse phase, a first purge phase, a nitrogen-containing plasma pulse phase, and a second purge phase. In some implementations, the titanium-containing pulse phase includes exposing the sidewalls and the bottom of the contact opening to a titanium-and-nitrogen containing precursor. In some implementations, the cycle of the ALD process is repeated until a thickness of the titanium-and-nitrogen containing barrier layer reaches a target thickness.

Another exemplary method includes forming a contact opening in a dielectric layer. The method further includes performing at least one first cycle of a first nitrogen-containing plasma pulse and a first purge, thereby nitridizing surfaces of the dielectric layer that define the contact opening. The method further includes performing at least one second cycle of a titanium-containing pulse, a second purge, a second nitrogen-containing plasma pulse, and a third purge, thereby forming a titanium nitride layer on the nitridized surfaces of the dielectric layer that define the contact opening. The method further includes forming a cobalt layer on the titanium nitride layer. In some implementations, the first cycle and the second cycle are performed at about the same temperature. In some implementations, the first cycle and the second cycle are performed without breaking vacuum, and further wherein the first cycle is performed in a first ALD chamber and the second cycle is performed in a second ALD chamber that is different than the first ALD chamber.

In some implementations, the first nitrogen-containing plasma pulse and the second nitrogen-containing plasma pulse generate diatomic nitrogen ($N_2$) plasma. In some implementations, the first purge removes remaining $N_2$ plasma and nitrogen-containing byproducts and the second purge removes remaining $N_2$ plasma and hydrocarbon-containing byproducts. In some implementations, a pressure maintained in an ALD chamber during the first nitrogen-containing plasma pulse is less than a pressure maintained in the ALD chamber during the first purge. In some implementations, the first nitrogen-containing plasma pulse converts $SiO_x$ to SiON and the second nitrogen-containing plasma pulse converts $TiNC_yH_z$ to TiN. In some implementations, titanium-containing pulse exposes the nitridized surfaces of the dielectric layer to tetrakis(dimethylamino)titanium (TDMAT). In some implementations, the second cycle is performed until a thickness of the titanium nitride layer is about 10 Å to about 30 Å.

An exemplary integrated circuit device includes a conductive feature, a dielectric layer disposed over the conductive feature, and a contact disposed in the dielectric layer. The contact is physically coupled with the conductive feature. The contact includes a titanium-and-nitrogen containing barrier layer disposed on nitridized surfaces of the dielectric layer and a surface of the conductive feature. The contact further includes a cobalt-containing bulk layer disposed on the titanium-and-nitrogen containing barrier layer. In some implementations, the dielectric layer includes silicon and oxygen, and the nitridized surfaces of the dielectric layer include silicon, oxygen, and nitrogen. In some implementations, the conductive feature is a gate structure, a source/drain feature, or a contact feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
   forming a contact opening in a dielectric layer, wherein the contact opening has sidewalls defined by the dielectric layer and a bottom defined by a conductive feature;
   performing an ALD-like nitrogen-containing plasma pre-treatment process on the sidewalls of the contact opening;

performing an ALD process to form a titanium-and-nitrogen containing barrier layer over the sidewalls and the bottom of the contact opening; and forming a cobalt-containing bulk layer over the titanium-and-nitrogen containing barrier layer, wherein the titanium-and-nitrogen containing barrier layer and the cobalt-containing bulk layer fill the contact opening.

2. The method of claim 1, wherein a cycle of the ALD-like nitrogen-containing plasma pre-treatment process includes:
a nitrogen-containing plasma pulse phase; and
a purge phase.

3. The method of claim 2, wherein the cycle of the ALD-like nitrogen-containing plasma pre-treatment process is performed about fifteen times to about thirty times.

4. The method of claim 1, wherein a cycle of the ALD process includes:
a titanium-containing pulse phase;
a first purge phase;
a nitrogen-containing plasma pulse phase; and
a second purge phase.

5. The method of claim 4, wherein the titanium-containing pulse phase includes exposing the sidewalls and the bottom of the contact opening to a titanium-and-nitrogen containing precursor.

6. The method of claim 4, wherein the cycle of the ALD process is repeated until a thickness of the titanium-and-nitrogen containing barrier layer reaches a target thickness.

7. The method of claim 1, wherein the ALD-like nitrogen-containing plasma pre-treatment process and the ALD process are performed in-situ.

8. The method of claim 1, wherein the ALD-like nitrogen-containing plasma pre-treatment process and the ALD process are performed at substantially the same temperature.

9. A method comprising:
forming a contact opening in a dielectric layer;
performing at least one first cycle of a first nitrogen-containing plasma pulse and a first purge, thereby nitridizing surfaces of the dielectric layer that define the contact opening;
performing at least one second cycle of a titanium-containing pulse, a second purge, a second nitrogen-containing plasma pulse, and a third purge, thereby forming a titanium nitride layer on the nitridized surfaces of the dielectric layer that define the contact opening; and
forming a cobalt layer on the titanium nitride layer.

10. The method of claim 9, wherein the first nitrogen-containing plasma pulse and the second nitrogen-containing plasma pulse generate diatomic nitrogen ($N_2$) plasma.

11. The method of claim 10, wherein:
the first purge removes remaining $N_2$ plasma and nitrogen-containing byproducts; and
the second purge removes remaining $N_2$ plasma and hydrocarbon-containing byproducts.

12. The method of claim 9, wherein a pressure maintained in an atomic layer deposition (ALD) chamber during the first nitrogen-containing plasma pulse is less than a pressure maintained in the ALD chamber during the first purge.

13. The method of claim 9, wherein:
the first nitrogen-containing plasma pulse converts $SiO_x$ to SiON; and
the second nitrogen-containing plasma pulse converts $TiNC_yH_z$ to TiN.

14. The method of claim 9, wherein the titanium-containing pulse exposes the nitridized surfaces of the dielectric layer to tetrakis(dimethylamino)titanium (TDMAT).

15. The method of claim 9, wherein the second cycle is performed until a thickness of the titanium nitride layer is about 10 Å to about 30 Å.

16. The method of claim 9, wherein the first cycle and the second cycle are performed at about the same temperature.

17. The method of claim 9, wherein the first cycle and the second cycle are performed without breaking vacuum, and further wherein the first cycle is performed in a first ALD chamber and the second cycle is performed in a second ALD chamber that is different than the first ALD chamber.

18. A method comprising:
etching a dielectric layer to form an opening that exposes a source/drain feature, a gate structure, or a contact feature of a multi-layer interconnect structure;
nitridizing surfaces of the dielectric layer that define the opening, wherein the nitridizing is achieved by performing at least one cycle of a nitrogen-containing plasma pulse phase;
depositing a conductive liner layer that includes titanium and nitrogen over the nitridized surfaces of the dielectric layer, wherein the conductive liner layer partially fills the opening;
depositing a conductive material over the conductive liner layer, wherein the conductive material fills a remainder of the opening; and
planarizing the conductive liner layer and the conductive material.

19. The method of claim 18, wherein:
the conductive liner layer is deposited by an ALD process; and
the conductive material is deposited by a CVD process or a PVD process.

20. The method of claim 18, further comprising in-situ nitridizing the surfaces of the dielectric layer and depositing the conductive liner layer.

* * * * *